United States Patent [19]
Barre

[11] Patent Number: 4,761,766
[45] Date of Patent: Aug. 2, 1988

[54] READ-WRITE CONTROL FOR ECL MEMORY

[75] Inventor: Claude Barre, Munich, Fed. Rep. of Germany

[73] Assignee: Siemens Aktiengesellschaft, Berlin and Munich, Fed. Rep. of Germany

[21] Appl. No.: 906,211

[22] Filed: Sep. 12, 1986

[30] Foreign Application Priority Data

Sep. 19, 1985 [DE] Fed. Rep. of Germany ....... 3533453

[51] Int. Cl.$^4$ .............................................. G11C 7/00
[52] U.S. Cl. .................................... 365/190; 365/189
[58] Field of Search ................ 365/154, 155, 179, 190

[56] References Cited

U.S. PATENT DOCUMENTS

| | | | |
|---|---|---|---|
| 3,529,294 | 9/1970 | Zuk | 365/155 |
| 4,272,811 | 6/1981 | Wong | 365/190 |
| 4,398,268 | 8/1983 | Toyoda | 365/190 |

FOREIGN PATENT DOCUMENTS

| | | | |
|---|---|---|---|
| 2046929 | 3/1972 | Fed. Rep. of Germany . | |
| 0142485 | 11/1980 | Japan | 365/155 |

OTHER PUBLICATIONS

Patent Abstracts of Japan, vol. 1, No. 18, Mar. 1977, p. 385 E 76, Patent Publication No. 51-114834.
Patent Abstracts of Japan, vol. 6, No. 22, Feb. 9, 1982, p. 85 P 1651, Patent Publication No. 56-143594.

*Primary Examiner*—Joseph A. Popek
*Attorney, Agent, or Firm*—Hill, Van Santen, Steadman & Simpson

[57] ABSTRACT

In an ECL memory array, each bit cell has a neutral state prior to each writing of data into a cell following a read access. A write-read control is provided, having a data input, two outputs for supplying output control signals to write-read transistors and two control inputs for two independent write-read control signals. The two output control signals assuming an upper value, a lower value or a intermediate value in accordance with said two write-read control signals and the data input signal, whereby in a transition from a read access to a write access, the level change of the second write-read control signal changes from high to low prior to the change of the first write-read control signal from low to high, so that said write-read control signals are both high immediately prior to each write access.

2 Claims, 2 Drawing Sheets

READ-WRITE CONTROL FOR ECL MEMORY

BACKGROUND

The present invention relates to a write-read control for an ECL memory and more particularly for an ECL memory incorporating a plurality of storage cells arranged in tows and columns with a plurality of storage cells in a given column connected in common to a pair of bit lines.

The read-write current on the bit lines is greater than the individual cell current in an ECL memory when a plurality of storage cells are arranged in each column of a memory array. In consequence, in the read-out mode, one of the two cross-coupled transistors of an addressed storage cell is driven into its saturation condition. If the cell content is modified during a subsequent write access, then the saturated transistor must be recharged, which produces a lengthening of the time requiring for writing in data to the cell.

In order to keep the disadvantages of the saturation within limits, in conventional circuits the manufacturing process must be controlled with extraordinary precision, with the goal of providing an extremely narrow tolerance for the current gain of the transistors. This contributes to the complexity of the manufacturing process, and increases the cost of the memories produced thereby.

BRIEF SUMMARY OF THE INVENTION

A principal object of the present invention is to eliminate the disadvantageous effect of saturation through the use of circuit means for providing write-read control in a way which reduces the effect of the saturation.

This and others object and advantages of the present invention will become manifest by a review of the following description and the accompanying drawings.

BRIEF DESCRIPTION OF THE DRAWINGS

Reference will now be made to the accompanying drawings in which.

DESCRIPTION OF THE PREFERRED EMBODIMENT

Figure 1:
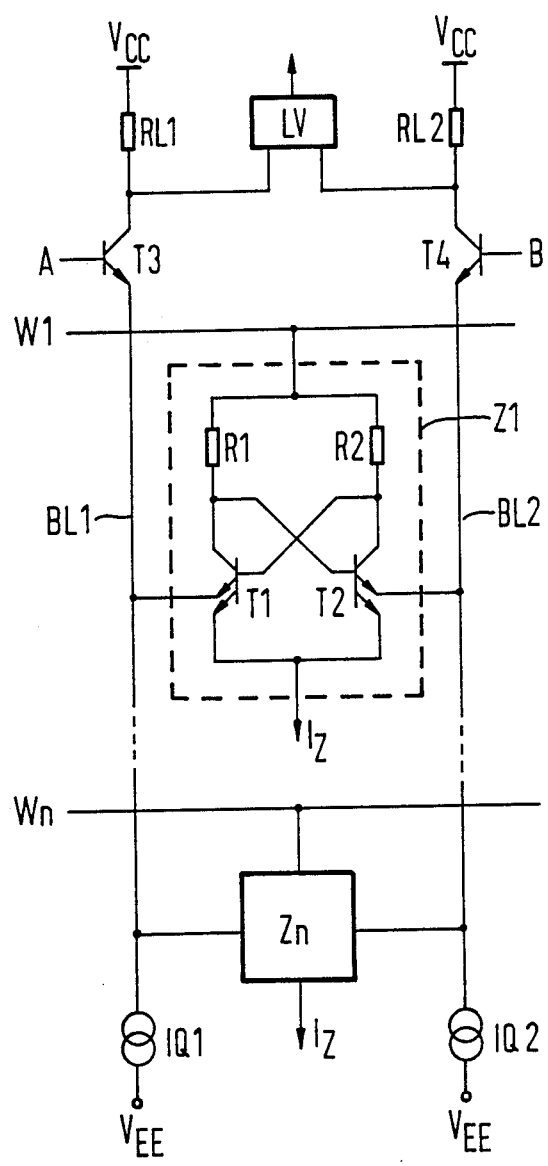
FIG. 1 is a schematic circuit diagram of a portion of a storage cell matrix, incorporating an illustrative embodiment of the present invention.

Referring to FIG. 1, two storage cells Z1 and Zn are shown, which are two of a larger number of storage cells arranged in an array with a plurality of rows and a plurality of columns, for instance 16 or 32 in each row and 32 cells in each column. Each cell comprises two double emitter transistors T1 and T2, which are cross coupled by mutual connections of the collector from one transistor to the base of the other. A constant cell current $I_Z$ is supplied to the first emitters of both transistors T1 and T2. The second emitters are connected to first and second bit lines respectively, BL1 and BL2. The collectors of the transistors T1 and T2 are connected to word selection lines W1, Wn, etc., via collector resistors R1 and R2. The word selection lines W1, Wn, etc. are provided in common for a plurality of storage cells located in a single row but in a plurality of different columns. Optionally diodes, poled in a forward direction, are connected in parallel with the collector resistors R1 and R2.

The word lines W1, Wn, etc., are driven by a word selection decoder (not shown) so that one and only one word line exhibits a relatively high potential, whereas all the other word lines manifest a lower potential.

The bit lines BL1 and BL2 are connected to constant current sources IQ1 and IQ2, respectively, at the bottom end as shown in FIG. 1, and are terminated at the opposite end by read resistors RL1 and RL2, respectively. The read resistors RL1 and RL2 manifest voltage drops when reading the content of a selected storage cell, in accordance with the content of the cell. The voltage drops are interpreted by a read amplifier LV, which produces an output corresponding to the content of the cell being read.

The emitter-collector paths of two transistors T3 and T4 are inserted into the bit lines BL1 and BL2, between the connecting points for the read amplifier LV, and all of these storage cells in a single column. The transistors T3 and T4 serve the purpose of write-read control, and are driven by means of control signals A and B supplied to the base terminals of these transistors.

In the following, an upper level binary signal (manifested as signal A or B) is identified as H, a lower level signal identified as L, and a signal level between H and L being identified M. Then during a write access the following relationships are valid, depending on the binary value of the data bit D to be written into the cell:

| D | A | B |
|---|---|---|
| H | L | H |
| L | H | L |

For a read access, A=B=M is valid.

During operation of the circuit of the present invention, a further group of signals A=B=H is generated in the transition phase, after a read access of a cell and before a following write access to the cell. This signal group begins at approximately the time that the cell is first addressed (at the time of an address change), and ends at the time of the beginning of the input of the data into the storage cell which is addressed, that is, the status A=B=H changes directly into A=L and B=H, or A=H and B=L.

Whereas in previous arrangements, a single binary control write signal W was adequate for defining the read-write function, a read control signal R is now necessary in order to be able to generate the additional neutral status A=B=H before each write access to a specified cell.

The dependence of the output control signals A and B (which control the transistors T3 and T4) to the write and read control signals W and R, and to any given data D is shown in the following table. The character X in the table indicates an arbitrary binary value.

| D | W | R | A | B |               |
|---|---|---|---|---|---------------|
| X | L | H | M | M | Read          |
| H | H | L | L | H | Write H       |
| L | H | L | H | L | Write L       |
| X | L | L | H | H | Neutral State |

Figure 2:
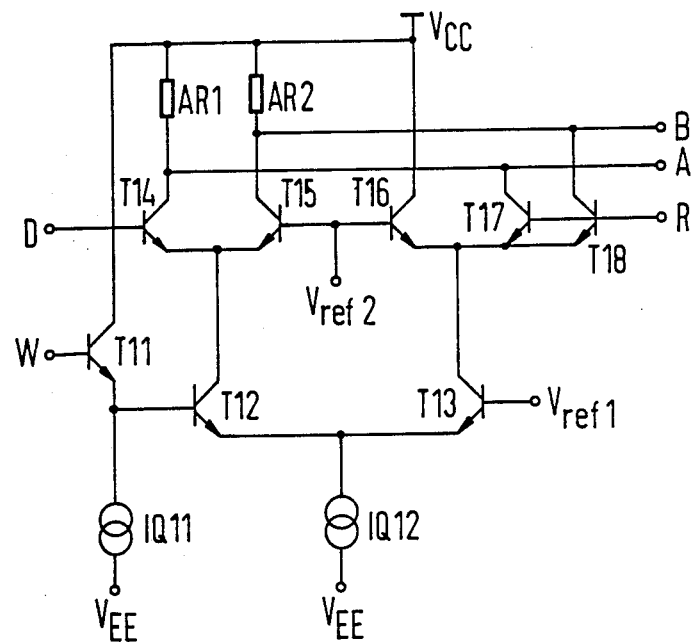
FIG. 2 is a schematic circuit diagram of a write-read control circuit constructed in accordance with the present invention.

Referring to FIG. 2, a circuit diagram is shown of an arrangement for deriving the output control signals A and B. A first differential amplifier is provided, incorporating transistors T12 and T13, and the write-read control signal W is supplied to the base of transistor T11 functioning as an emitter follower. The emitter of the transistor T11 is connected to the base of the transistor T12, to supply an input to the differential amplifier. The emitter of the transistor T11, and the base of the transistor T12, are furthermore connected to a source of potential $V_{EE}$ through a constant current source IQ11.

The emitters of the transistors T12 and T13 are connected in common to a voltage source $V_{EE}$ through a constant current source IQ12. The base of the transistor T13 is connected to a reference potential $V_{ref1}$.

A second differential amplifier is formed by transistors T14 and T15. The emitters of these transistors are connected together and to the collector of the transistor T12. The second differential amplifier is controlled by the data input signal D which is supplied to the base of the transistor T14. The base of the transistor T15 is connected to a second reference potential $V_{ref2}$.

A third differential amplifier incorporates transistors T16, T17 and T18, all of which have their emitters connected in common to the collector of the transistor T13. The base of the transistor T16 is connected to the reference potential $V_{ref2}$ and the transistors T17 and T18 both their bases connected to the write-read control signal R. The collectors of the transistors T14 and T17 are connected together to a first load resistor AR1 which interconnects these collectors with a potential source $V_{CC}$. These collectors are also connected to an output terminal for manifesting the output control signal A.

The collectors of the transistors T15 and T18 are connected in common and to one end of the second load resistor AR2, the other end of which is connected to the potential source $V_{CC}$. The collectors of the transistors T15 and T18 are also connected to a terminal for manifesting the output control signal B.

In operation, when the write-read signal W is high, the output control signals A and B depend only on the level of the data input signal D. The write read control signal R has no influence, because the transistor T13 of the first differential amplifier is without current during the writing operation.

When the write-read control W signal is low, then the level of the output control signals A and B are dependent only on the level of the write-read control signal R, because the transistor T12 is without current during a reading operation. With the write-read control signal R high, the current supplied by the constant current source IQ12 is divided equally between the two load resistors AR1 and AR2, so that this voltage drop is only half of the typical value. When the write-read control signal R is low, however, the entire current from the constant current source IQ12 flows through the transistors T13 and T16, and thus does not cause a voltage drop in either the load resistors AR1 and AR2. This a neutral state.

Figure 3:
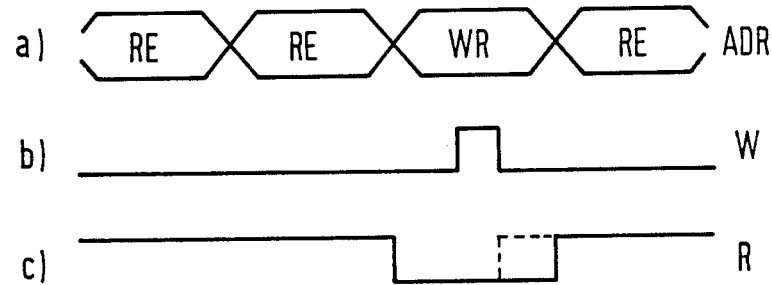
FIG. 3 is a series of waveforms relative to time illustrating operation of the apparatus of FIGS. 1 and 2.

The time diagram of FIG. 3 shows the memory addresses ADR in the upper row (a). The four sections of this line having parallel horizontal lines identify the periods during which the address at the address inputs of the memory are valid. Address change occurs in the intervening sections having oblique crossing lines. As shown in line (a) of FIG. 3, one of the four sections is a write access WR, with the others being read accesses RE; the write access coincides with a write-read control signal W.

Line (b) of FIG. 3 shows the write-read control signal W. W=L is valid for read accesses, with write access defined by W=H, which occurs during a limited time.

Line (c) of FIG. 3 shows the write-read control signal R which is high for read accesses and low for write accesses. However, for a write access, the change in the level of the control signal R (from high to low) takes place significantly earlier than the change in the write-read control signal W (from low to high). The earliest time in which the write-read control signal R can be brought low is at the conclusion of a preceding read event, which is at the end of the second section shown in FIG. 3, line (a). The time interval between the signal changes R and W must be sufficient to allow return from the initially cited saturation condition of one of the two coupled transistors in the address storage cell.

The change of the write-read control signal R from low to high can, if desired, can take place simultaneously with the change of the first write-read control signal W from high to low, thus skipping the neutral state after writing, or can take place later, in which case, the neutral state is retored after writing and before the next access. This is indicated in FIG. 3, line (c) with the solid and broken lines indicating the two possibilities.

Because of the high levels of the output control signals A and B prior to a write access, the current contributed to each bit line by the transistors T3 and T4 is greater, thus requiring less current from the transistors of the various memory cells in order to equal the total current drawn by the constant current sources IQ1 and IQ2. thus, the transistor of the memory cell tend to be relaxed from saturation, prior to the write control pulse, which allows a faster write operation, and therefore faster overall operating times for the memory cell.

It will be appreciated from the above description that the disadvantageous conditions of saturation of the transistors of a memory cell are largely avoided by the present invention. It is apparent that various modifications and additions in the apparatus of the invention may be made by those skilled in the art without departing from the essential features of novelty thereof, which are intended to be defined and secured in the appended claims.

What is claimed is:

1. In a write-read control for an ECL memory having a plurality of storage cells arranged in rows and columns, said storage cells in a given column being connected in common to a pair of bit lines, said bit lines serving as data inputs and data outputs for said cell, a pair of write-read transistors having their collectors and emitters connected in series with said bit lines, said write-read control comprising; means for supplying output control signals to the bases of said two write-read transistors in response to first and second control input signals (W and R) for causing said output control signals to assume an upper value H, a lower value L, or an intermediate value M, in accordance with said two write-read control signals, said output control signals assuming opposite H and L values when said two control input signals (W and R) are high and low respectively, said output control signals both assuming an intermediate value M when said write-read control signals (W and R) are low and high respectively, and said output control signals both assuming a high value when said write-read signals (W and R) are both low, and means for changing the level of the write-read control signal R from high to low prior to the change of the level of the write-read control signal W from low to high, during a transition from a read access to a write access, whereby said output control signals are both high immediately prior to each write access.

2. apparatus according to claim 1, including a first differential amplifier, a first constant current source connected to said first differential amplifier, said first differential amplifier having first and second emitter-coupled transistors, an emitter-follower transistor, means for connecting the base of said first transistor to the emitter of said emitter-follower transistor, means for connecting said write-read control signal W to the base of said emitter follower transistor, means for connecting the base of the said second transistor to a first reference potential, a second differential amplifier incorporating two transistors having their emitters connected in common to the collector of said first transistor, the collectors of said transistors of said second differential amplifier being connected to said outputs for supplying said output control signals, a pair of load resistors connected between the collectors of said transistors of said further differential amplifiers and a potential source, means for supplying a data signal to the base of one transistor of said second differential amplifier, means for connecting the base of the other transistor of said second differential amplifier to a second reference potential, a third differential amplifier incorporating first, second and third transistors having their emitters connected in common to the collector of the second transistor of the first differential amplifier, means for connecting the collector of the first transistor of the third differential amplifier to said potential source and its base to said second reference potential, and means for connecting the collectors of the second and third transistors of said third differential amplifier each to one of the outputs for said output control signals, and means for connecting said write-read control signal R to the bases of said second and third transistors of said third differential amplifier.

* * * * *